United States Patent [19]
Sato

[11] 3,942,981
[45] Mar. 9, 1976

[54] METHOD FOR FORMING MICROPATTERNS UTILIZING A TRANSPARENT RAISED IMAGE AS PHOTOMASK

[75] Inventor: Masamichi Sato, Saitama, Japan

[73] Assignee: Fuji Photo Film Co., Ltd., Minami-ashigara, Japan

[22] Filed: May 6, 1974

[21] Appl. No.: 467,544

[30] Foreign Application Priority Data
May 4, 1973 Japan.............................. 48-50426

[52] U.S. Cl..................... 96/36; 96/27 R; 96/35; 96/36.2; 96/38.3; 96/44
[51] Int. Cl.² ...................... G03C 5/00; G03C 5/06
[58] Field of Search.............. 96/44, 36, 38.3, 27 R, 96/27 E, 35, 36.2

[56] References Cited
UNITED STATES PATENTS

| 3,503,681 | 3/1970 | Jons et al. ................... 96/27 E UX |
|---|---|---|
| 3,653,898 | 4/1972 | Shaw...................................... 96/44 |
| 3,719,487 | 3/1973 | Schutze et al. ......................... 96/44 |
| 3,744,904 | 7/1973 | Loprest et al................. 96/38.3 UX |
| 3,801,410 | 4/1974 | Detrick et al......................... 96/38.3 |

*Primary Examiner*—Edward C. Kimlin
*Attorney, Agent, or Firm*—Sughrue, Rothwell, Mion, Zinn & Macpeak

[57] ABSTRACT

A method for forming micropatterns comprising, superposing a transparent raised image formed on a transparent substrate on a photosensitive layer of a photographic material or forming a transparent raised image on the photosensitive layer of the photographic material, uniformly exposing the photosensitive layer through the transparent raised image to light to which the photosensitive layer is sensitive so that the light intensity at edges of the transparent image is non-uniform, and developing the photosensitive layer to form a micropattern corresponding to the outlines of the transparent raised image.

15 Claims, 10 Drawing Figures

METHOD FOR FORMING MICROPATTERNS UTILIZING A TRANSPARENT RAISED IMAGE AS PHOTOMASK

BACKGROUND OF THE INVENTION

1. Field of the Invention

This invention relates to a method for forming micropatterns using a transparent raised image which can provide non-uniform light intensity regions less than the diffraction limit at the edges of the transparent image when the transparent image is uniformly exposed to light.

2. Description of the Prior Art

The limit of resolution obtained using known photolithographic techniques is about one micron. It is difficult to obtain line widths less than one micron because of the diffraction limits of light and resolution limit of a photosensitive material itself. When a silver halide photograhic material is used, small lines ranging from 1 to 2 microns can be obtained. However, the edges of the lines are granular because of the silver grains.

The present invention provides lines of high resolution beyond the diffraction limit of light and good edge acuity.

SUMMARY OF THE INVENTION

An object of this invention is to provide a method for forming lines of high resolution beyond the diffraction limit of the light.

A further object of this invention is to provide a method for forming lines of high resolution with good edge acuity.

Another object of this invention is to provide a method for forming micropatterns corresponding to the outlines of a transparent raised image.

This invention comprises a method for forming micropatterns which comprises superposing a transparent raised image formed on a transparent substrate on a photosensitive layer of a photographic material or forming a transparent raised image on the photosensitive layer of the photographic material, uniformly exposing the photosensitive layer to active light through the transparent raised image in a manner such that the light intensity at the edges of the transparent raised image is non-uniform, and developing the photosensitive layer to form a micropattern corresponding to the outlines of the transparent raised image.

DETAILED DESCRIPTION OF THE INVENTION

Figure 1:
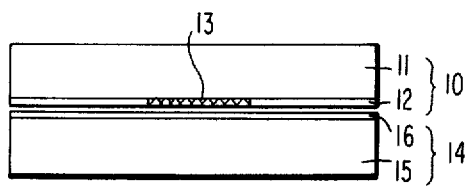
FIG. 1 illustrates a photomask superposed on a photo-resist layer coated on a transparent substrate on which a transparent raised image is to be formed.

Referring now to FIG. 1 in which a photomask is superposed on a photoresist layer and the photoresist layer is exposed through the photomask by irradiating the assembly uniformly with light, reference character 10 designates an emulsion photomask obtained using a silver halide photographic material.

Suitable silver halide emulsions which can be applied to a transparent support can be obtained by dispersing silver halide in a water-soluble binder. Illustrative silver halides are silver chloride, silver bromide, silver iodide, slver chlorobromide, silver bromoiodide, silver chlorobromoiodide, and the like. A preferred representative silver halide emulsion is an emulsion which contains not less than 90 mol% silver bromide (preferably containing not more than 5 mol% slver iodide), which contains silver halide grains of a mean grain size of not more than about 0.1 $\mu$ (a so-called Lippmann emulsion), and in which the weight ratio of silver halide to the water-soluble binder is about 1:4 to about 6:1. Another example of a silver halide emulsion is an emulsion which contains not less than 50 mol% (preferably, not less than 70 mol%) silver halide and which contains silver halide grain of a mean grain size of not more than about 1.0 $\mu$.

On the other hand, suitable water-soluble binders are, for example, gelatin, colloidal albumin, casein, cellulose derivatives (e.g., carboxymethyl cellulose, hydroxyethyl cellulose, etc.), polysaccharides (e.g., agar-agar, sodium alginate, starch derivatives, etc.), synthetic hydrophilic colloids (e.g., polyvinyl alcohol, poly-N-vinylpyrrolidone, polyacrylic acid, polyacrylamide, derivatives thereof, etc.). If desired, a mixture of two or more of these binders which are compatible can be used. Of these, gelatin is the most preferred binder. Part or all of the gelatin can be repeaced by a synthetic high molecular weight substance, by a so-called gelatin derivative which is prepared by treating gelatin with a reagent having a group capable of reacting with the functional groups of the gelatin molecule (i.e., amino groups, imino groups, hydroxy groups and carboxy groups), or by a graft polymer which is prepared by connecting molecular chain of another high molecular weight substance to gelatin. Suitable reagents which can be used in preparing gelatin derivatives are, e.g., the isocyanates as described in U.S. Pat. No. 2,614,928, the acid chlorides and acid anhydrides, as described in U.S. Pat. No. 3,118,766, bromoacetic acid as described in Japanese Patent Publication No. 5514/64, the phenylglycidyl ethers described in Japanese Patent Publication No. 21845/67, the vinylsulfone compounds as described in U.S. Pat. No. 3,132,945, the N-alkylvinylsulfonamides as described in British Pat. No. 861,414, the maleinamide compounds as described in U.S. Pat. No. 3,186,846, the acrylonitriles as described in U.S. Pat. No. 2,594,293, the polyalkyleneoxides as described in U.S. Pat. No. 3,312,553, the epoxy compounds as described in Japanese Patent Publication No. 26845/67, the acid esters as described in U.S. Pat. No. 2,763,639, the alkanesultones as described in British Pat. No. 1,033,189, and the like. Suitable branch polymers to be grafted to gelatin are described in U.S. Pat. Nos. 2,763,625, 2,831,767, and 2,956,884, and in Polymer Letters, 5, 595 (1967); Phot. Sci. Eng., 9, 148 (1965); J. Polymer Sci. A-1, 9, 3199 (1971), and the like. In general, polymers or copolymers of the so-called vinyl monomers such as acrylic acid, methacrylic acid, or their ester, amide or nitrile derivatives, styrene, and the like can widely be used. However, hydrophilic vinyl polymers having some compatibility with gelatin, such as the polymers or copolymers of acrylic acid, acrylamide, methacrylamide, hydroxyalkyl acrylate, hydroxyalkyl methacrylate, and the like are particularly desirable.

Optionally, these emulsions can be advantageously optically sensitized using known optical sensitizing agents such as the cyanine dyes and merocyanine dyes as described in U.S. Pat. Nos. 1,346,301, 1,846,302, 1,042,854, 1,990,507, 2,493,747, 2,739,964, 2,493,748, 2,503,776, 2,519,001, 2,666,761, 2,734,900, 2,739,149, and British Pat. No. 450,958.

With optically sensitized photographic light-sensitive materials, it is convenient to select, as the light for exposing the emulsion layer, light of a wavelength mainly falling within the optically sensitized region of the emulsions.

As described in U.S. Pat. Nos. 2,448,060, 2,566,245 and 2,566,263, emulsions are advantageously processed with a salt of a noble metal such as ruthenium, rhodium, palladium, iridium, platinum, etc. Also, the emulsions can be chemically sensitized with a gold salt as described in U.S. Pat. No. 2,339,083, or can be stabilized with a gold salt as described in U.S. Pat. Nos. 2,597,856 and 2,597,915. Furthermore, emulsions can advantageously contain a thio polymer as described in U.S. Pat. No. 3,046,129, and can be stabilized with mercury compounds, triazoles, azaindenes, quaternary benzothiazolium compounds, zinc salts and cadmium salts, as described in U.S. Pat. No. 3,046,129.

The emulsions can also contain light-absorbing dyes as described in U.S. Pat. Nos. 2,527,583, 2,611,696, 3,247,127, 3,260,601, etc.

If desired, the emulsions are advantageously hardened with a suitable hardener for hydrophilic colloids, such as formaldehyde, halogen-substituted fatty acids (e.g., mucobromic acid, etc.), various compounds containing an acid anhydride group, a methanesulfonic acid diester, a dialdehyde or a sodium bisulfite derivative of a dialdehyde (e.g., β-methylglutaraldehyde bisodium bisulfate, etc.), a bisaziridinecarboxyamide (e.g., trimethylenebis1-aziridinecarboxyamide, etc.), a triazine derivative (e.g., 2-hydroxy-4,6-dichloro-s-triazine, etc.), and the like.

Silver halide emulsion can be coated, after the addition of or without the addition of a coating aid as described in U.S. Pat. No. 3,046,129, on a support. The silver halide emulsion layer is preferably not more than about 10 $\mu$ in thickness and can be coated in at least one layer. If desired, a backing layer, an anti-halation layer, an interlayer, an uppermost layer (e.g., protective layer, etc.), a subbing layer, and the like, can be provided on the support or on the emulsion layer.

The formation of silver images on the silver halide emulsion layer can be effected using conventional photographic processings. That is, the emulsion layer is imagewise exposed, developed and, if necessary, fixed.

In the method of the present invention, suitable developing agents for forming silver images are those which are generally well known in the art, such as the dihydroxybenzenes (e.g., hydroquinone, chlorohydroquinone, bromohydroquinone, isopropylhydroquinone, toluhydroquinone, methylhydroquinone, 2,3-dichlorohydroquinone, 2,5-dimethylhydroquinone, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), the aminophenols (e.g., o-aminophenol, p-aminophenol, N-methyl-o-aminophenol, 2,4-diaminophenol, etc.), pyrogallol, ascorbic acid, the 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.) or a mixture thereof. The pH of the developer used generally is not less than about 8, preferably about 8.5 to 12.5.

The developer can contain, if desired, a preservative (e.g., a sulfite, a bisulfite, etc.), a buffering agent (e.g., a carbonate, boric acid, a borate, an alkanolamine, etc.), an alkali agent (e.g., a hydroxide, a carbonate, etc.) a dissolving aid (e.g., a polyethylene glycol, etc.), a pH-adjusting agent (e.g., acetic acid or a like organic acid), a sensitizing agent (e.g., quaternary ammonium salt, etc.), a development accelerator, a surface active agent, etc.

On the other hand, suitable fixing agents for the silver halide are those generally well known, such as a water-soluble thiosulfate (e.g., potassium thiosulfate, sodium thiosulfate, ammonium thiosulfate, etc.), a (e.g., potassium thiocyanate (e.g.,potassium thiocyanate, sodium thiocyanate, ammonium thiocyanate etc.), a water-soluble, organic diol (e.g., 3-thia-1,5-pentadio 3,6-dithia-1,8-octanediol, 3,6,9-trithia-1,1,1undecanediol, 3,6,9,12-tetrathia-1,14-tetradecanediol, etc.), a water-soluble sulfur-containing dibasic acid (e.g., ethylenebisthioglycollic acid, etc.), a water-soluble salt, or the mixture thereof.

The solution containing the fixing agent can contain, if desired, a preservative (e.g., a sulfite, a bisulfite, etc.), a pH-buffering agent e.g., boric acid, a borate, etc.), a pH-adjusting agent (e.g., acetic acid, etc.), a chelating agent, and the like.

A positive type and a negative type photoresist can be used, for example, in a thickness of about 0.1 $\mu$ to 10 $\mu$. Suitable examples of a commercially available negative type photoresist is KMER (a trade name for a natural polyisoprene, produced by Kodak) using xylene as a developer, KTFR (a trade name for a synthetic polyisoprene, produced by Kodak) using xylene as a developer and KPR (a trade name for a polyvinylcinnamic acid material).

A suitable example of a positive type photoresist is AZ-1350 (trade name for a mixture of a quinone diazide and a novalac resin, produced by the Shipley Co.) using an 2% by weight aqueous solution of sodium hydroxide, for example, as a developer.

As an emulsion mask, a high resolution photographic plate such as Kodak High Resolution Plate (trade name for a high resolution silver halide emulsion coated on a glass support, made by the Eastman Kodak Company) can be used.

Reference characters 11, 12, and 13 in FIG. 1 designate a glass substrate, a gelatin layer and a silver image formed in the gelatin layer, respectively. 14 designates a photoresist plate which comprises a glass substrate 15 and, for example, a positive type photoresist layer 16 coated thereon, for example, in a thickness of about 0.1 to 5 $\mu$. After the emulsion mask is superposed on the photoresist plate so that the photoresist layer 16 and the silver image 13 are in contact, a light to which the photoresist is active is uniformly applied to the photoresist layer 16 through the emulsion mask 10.

Figure 2:
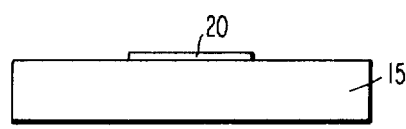
FIG. 2 shows a side sectional view of the substrate on which a transparent image is formed.

After the uniform exposure to parallel light, the photo-resist is developed. After the photoresist plate is developed in the developer for about 20 seconds, the plate is rinsed with water and dried, and the transparent raised photoresist image 20 is obtained on the glass plate 15 as shown in FIG. 2. The raised image 20 corresponds to the silver image 13 of the emulsion mask.

The term "parallel light" as used herein means light whose rays all strike the surface at the same angle of incidence to the surface, with an angle of incidence of about 90° being preferred. The closer the angle of incidence to an incidence angle of 90°, the more preferred is the angle of incidence. Suitable light sources which can be used are a tungsten lamp, a fluorescent lamp, a mercury lamp, etc. To achieve the parallel light radiation described above, the light source can simply be placed at a distance from the surface to be exposed. Further, the edge is slightly convex at the shoulder of the edge. Therefore, the incident light ray 31 which passes the shoulder portion of the edge is slightly deflected, although the incident light rays 32 and 33 which pass the tapered region are deflected to a greater extent. The parallel incident light rays 30 and 34 pass through without being deflected. The light intensity distribution in the plane which includes the upper surface of the raised image 20 is shown in the upper half of FIG. 3.

Figure 3:
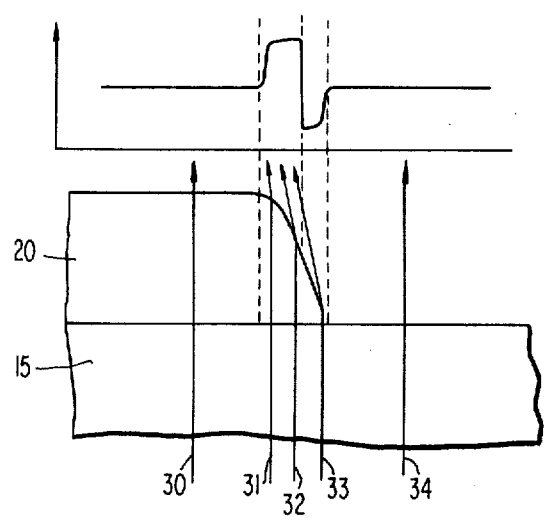
FIG. 3 illustrates the passage of the incident light rays and the light intensity distribution around the edge of the transparent raised image.
Figure 4:
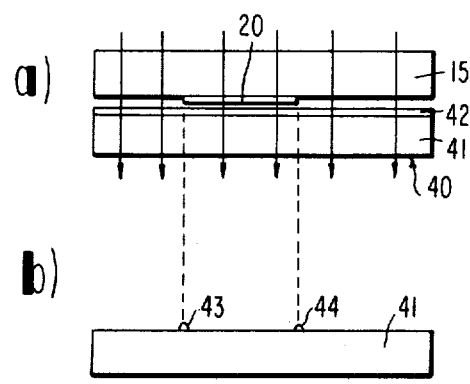
FIG. 4(a) illustrates a transparent raised image superperposed on a photoresist layer coated on a substrate.
FIG. 4(b) illustrates a developed micropattern.

FIG. 4(a) illustrates a photoresist plate 40 on which the photoresist plate obtained above is superposed so that the raised image 20 contacts the photoresist layer 42. A light to which the photoresist layer 42 is active is applied to the layer 42 though the glass substrate 15. Reference character 41 designates a glass substrate of the photoresist plate 40. AZ-1350 can be used for the photoresist layer 42. The photoresist layer 42 is not exposed to the light at the edges of the raised image 20, because the light intensity distribution on the photoresist layer 42 is same as shown in FIG. 3. After developing, photoresist lines 43 and 44 which correspond to the outline of the raised image 20 are obtained. It is easy to fix the thickness and width of the raised image 20 to 0.6 microns and 5 microns, respectively. It is also quite easy to form small lines 43 and 44 with a line width less than 1 micron using such a raised image. A line width of 0.3 microns can be obtained, for example. More specifically, line widths ranging from about 0.1 micron to several microns can be achieved using the method of this invention.

It is clear from the description above that the line width of the small lines depends on the angle (between the substrate surface and the edge wall) of taper of the edge, the curvature of the shoulder of the edge and the thickness of the raised image. Even a small angle of taper can produce thin lines provided that the thickness of the raised image is small, or vice versa. The larger the curvature of the shoulder is, the thinner are the lines which can be produced. It is preferable that the outlines of the edges be smooth. A raised image obtained on a transparent substrate using a photoresist usually has edges with smooth outlines regardless of the type of photoresist, consequently a photoresist raised image is advantageously used in the present invention.

A transparent raised image which can be used for the present invention is not limited to a photoresist raised image but other transparent raised images such as a gelatin relief image employing materials hereinbefore described can also be used. The gelatin relief image can be obtained using known methods such as an etching bleach method, a tanning bleach method or a tanning development method.

Figure 5:
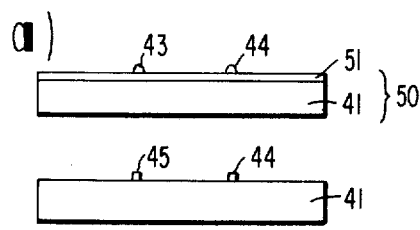
FIG. 5(a) illustrates the micropattern formed on a thin metal layer coated on a substrate.
FIG. 5(b) illustrates thin metal lines corresponding to the micropattern.

The present invention can be applied to the production of fine metal lines. FIG. 5 (a) and (b) illustrate the process of producing fine metal lines on a glass substrate. Instead of the photoresist plate 40, an aluminum deposited glass substrate 41 on which the photoresist layer is formed is used. The thickness of the aluminum layer can range from about 0.1 to 0.2 microns, for example. Alternatively, deposited layers of metals such as silver, copper, chromium and the like can be employed for the aluminum deposited layer, and a plastic film support can be used for the glass support, if desired. A suitable thickness for the deposited metal layer can range from about 300 A to 30,000 A. The transparent raised image is superposed on the photoresist layer in the same manner as described above and then a light is applied uniformly to the photoresist layer through the raised image. After developing, fine photoresist lines 43 and 44 are formed on the aluminum layer 51 as shown in FIG. 5 (a). Then, the aluminum layer is etched away leaving the aluminum under the photoresist lines 43 and 44. Finally, the photoresist lines 43 and 44 are removed to form fine metal lines 45 and 46 as shown in FIG. 5 (b).

Figure 6:
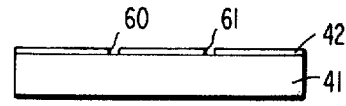
FIG. 6 illustrates a photoresist layer which has hollow lines instead of raised lines.

The use of a positive type photoresist has been described hereinbefore. The use of a negative type photoresist as set forth above will be described hereinafter. Typical commercially available negative type photoresists as described hereinbefore include KMER and KTFR. Many other negative type photoresists are commercially available. The transparent raised image is superposed on the negative type photoresist layer coated on a substrate, and after uniform exposure the photoresist layer is developed using a developer for the photoresist. Fine hollow lines 60 and 61 are obtained as shown in FIG. 6.

Figure 7:
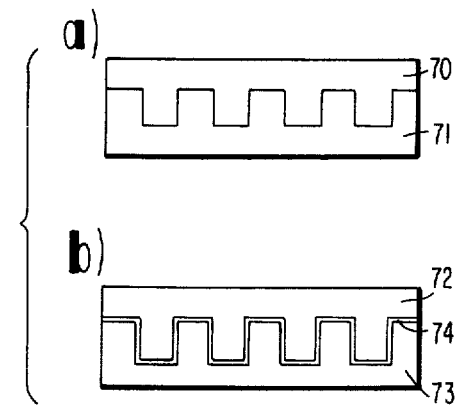
FIG. 7(a) illustrates a photomask to form a comb structure electrode.
FIG. 7(b) illustrates a comb structure electrode obtained.

The method for producing a comb structure electrode using the process described above is described hereinafter. In FIG. 7 (a), 71 designates a comb shaped transparent raised pattern formed on a glass substrate 70. The raised pattern is superposed on a negative type photoresist coated on a thin metal layer coated on a substrate. After uniform exposure and development of the photoresist layer, the photoresist layer provides two comb structures separated by a hollow line 74.

Then, the exposed metal at the line 74 is etched away. Finally, the photoresist is removed to form two comb shaped electrodes 72 and 73 separated by the small gap 74 as shown in FIG. 7 (b).

A thin layer of tantalum or nichrome which has a high electrical resistivity can be used instead of metal layer 51 to obtain resistors with a large resistance value and a small size. For this purpose the transparent raised image as shown in FIG. 7 (a) and the positive type photoresist are used to obtain the side section as shown in FIG. 5 (a). After uniform exposure, development of the photoresist, etching of the resist layer and removal of the photoresist, a thin resistor line corresponding to the fine line 74 in FIG. 7 (b) is obtained.

Figure 8:
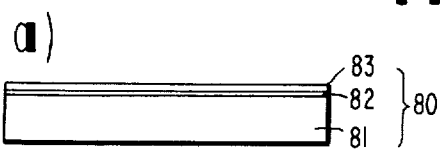
FIG. 8(a) illustrates a photographic material on which a photoresist layer is coated directly.
FIG. 8(b) illustrates the photographic material on which a transparent raised image is formed.
Figure 8:
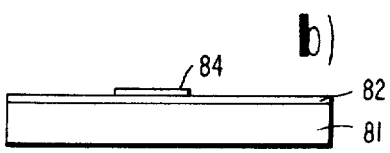

FIG. 8 (a) illustrates the side section of a photoresist plate 80 having two photoresist layers 82 and 83 coated on a glass substrate 81. The photoresist layer 82 is a negative type and the layer 83 positive type. The photomask is superposed on the photoresist layer 83 and then the layer is uniformly exposed through the photomask to light to which only the photoresist layer 83 is sensitive. The photoresist layer 83 is then developed using a developer which neither dissolves nor swells the photoresist layer 82 to form a raised image 84 on the photoresist layer 82 as shown in FIG. 8 (b). As the positive type photoresist, AZ-1350 can be used and as the negative type photoresist, KMER can be used, and as the developers for AZ-1350 and KMER, a dilute aqueous solution of sodium hydroxide and xylene can be used, respectively. Then, the photoresist layer 82 is uniformly exposed to light to which the layer 82 is sensitve. The incident light is deflected at the edges of the raised image 84, consequently similar hollow lines as shown in FIG. 6 are formed on the glass substrate 81 after the raised image 84 is removed and the photoresist layer 82 is developed. To remove the raised image 84 which consists of AZ-1350, acetone which does not affect KMER can be used.

In the above photoresist combination, the uniform exposure to light may be to light to which both photoresist layers 82 and 83 are sensitive, because the raised image 84 is formed in the unexposed portion of the layer 83 whereby the corresponding portion of the photoresist layer 82 is not exposed in the first uniform light exposure. At the second exposure the phenomenon described by referring to FIG. 3 occurs under the edges of the raised image 84.

For the photoresist plate 80 both photoresist layer 82 and 83 may be positive or negative. Fine photoresist lines 43 and 44 as shown in FIG. 5 (a) can be used as a new raised image to form even finer lines.

The light which is to be uniformly applied to the photoresist layer is preferred to be parallel, because parallel light can provide a larger non-uniform light intensity distribution at the edges of the raised image. However, the uniform light need not always be parallel.

The formation of fine lines using a photoresist layer has been described hereinbefore, however, any photosensitive material can be used instead of the photoresist. For instance, instead of FIG. photoresist plate 40 in FIG 4 (a), a silver halide photographic film can be used to form black or clear outlines of the raised image 20.

A transparent raised image of a transparent photoresist has been used hereinbefore. The transparent raised image can be produced by using a silver halide photographic material, as well. A silver image is formed in a silver halide emulsion layer coated on a transparent substrate. The formation of the silver image is accomplished using a known method which comprises exposing the silver halide emulsion layer to an optical image and developing. Fixing can also be included if desired. The silver image is then bleached with a bleaching solution containing a dichromate. Typical bleaching solutions which can be used in the present invention include an aqueous solution of ammonium dichromate, potassium dichromate, sodium dichromate and a mixture of these dichromates. The bleaching solution can contain acids such as hydrochloric acid, sulfuric acid, nitric acid and ammonium chloride. A preferred dichromate concentration can range from about 2 to 100 g/liter using the acid at a level of several milliliters to several tens of milliliters per liter. A silver compound formed by the bleaching process in removed by a solvent for the silver compound. When the silver image is bleached with an aqueous solution of a dichromate and hydrochloric acid or ammonium chloride, the silver image is converted into a silver chloride image which can be removed using a silver chloride solvent such as an aqueous solution of sodium thiosulfate, potassium thiosulfate, ammonium thiosulfate, sodium thiocyanate, potassium thiocyanate, ammonium thiocyanate, 3-thia-1,5-pentanediol, 3,6-dithia-1,8-octanediol, 3,6,9-trithia-1,11-undecanediol, 3,6,9,12-tetrathia-1,14-tetradecanediol, ethylenebisthioglycolic acid or a mixture of these silver chloride solvents. A suitable concentration for the silver solvent can range from about 5 to 50 percent by weight. When an aqueous solution of a dichromate and nitric acid is used as the bleaching solution, the silver image is converted into a silver dichromate image which can be removed using a solvent such as nitric acid, aqueous ammonia or potassium cyanide. When sulfuric acid is used instead of the nitric acid described above, no silver compound is formed, consequently, the silver compound removal step can be omitted. After the silver compound is removed the photographic material is washed in running water and dried. It is observed that the image areas are clear and that the thickness thereof is several times larger than that of the original silver image. Thus a transparent raised image is obtained.

Figure 9:
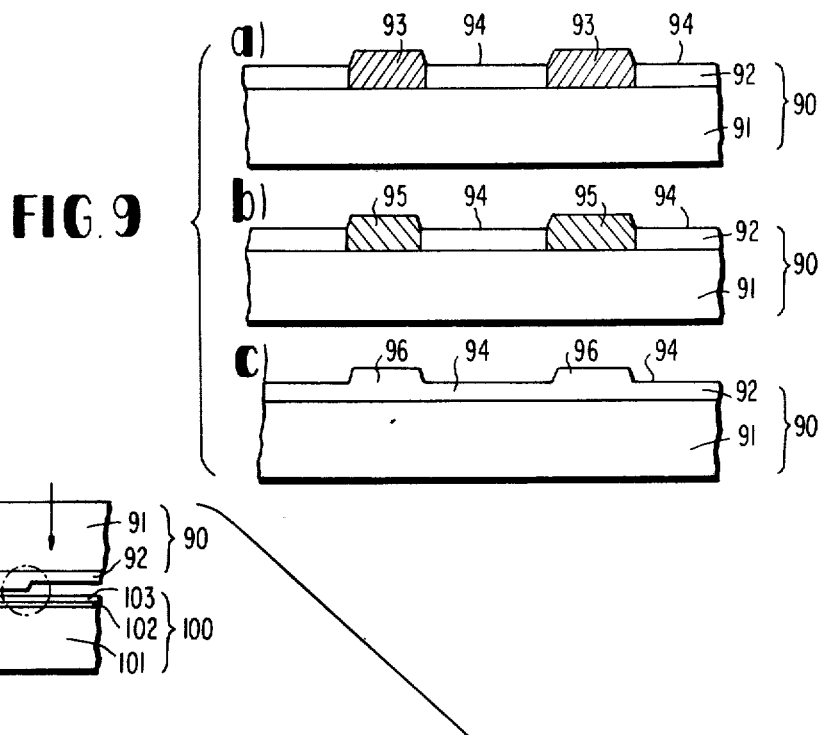
FIG. 9 illustrates side sectional views of a silver halide photographic material with FIG. 9(a) showing a silver image, FIG. 9(b) showing a bleached silver image, and FIG. 9(c) showing dissolved silver halide to form a transparent gelatin raised image.

Referring to FIG. 9 (a), reference character 90 designates a silver halide photographic material comprising a transparent substrate 91 such as a glass plate, an emulsion layer 92 formed thereon and a silver image 93 formed in the emulsion layer. 94 designates non-image gelatin areas. When a Kodak High Resolution Plate is used as a photographic material, the thickness of the gelatin areas 94 is about 2 microns and that of the silver image 93 is about 4 microns. FIG. 9 (b) illustrates the bleached photographic material wherein the silver image 93 is converted into a silver compound image 95. FIG. 9 (c) illustrates the photographic material wherein the silver compound is removed leaving the transparent raised image 96.

The binder of the bleached areas is hardened, while the binder of the non-bleached areas is not hardened. Therefore, the binder of the non-bleached areas can be washed away with warm water leaving a gelatin relief which can also be used as a transparent raised image.

Bleaching solutions which do not contain a dichromate do not provide good transparent raised images because such bleaching solutions neither raise nor harden the binder of the image areas.

A transparent gelatin relief can also be obtained using an etching bleach process wherein the silver image is etched away together wth the binder at the image areas with an etching bleach solution. Any known etching solution can be used for this purpose such as an aqueous solution of cupric chloride, citric acid and hydrogen peroxide, and an aqueous solution of curpic nitrate, potassium bromide, lactic acid and hydrogen peroxide and an aqueous solution of ferric nitrate, potassium bromide, lactic acid and hydrogen peroxide.

Figure 10:
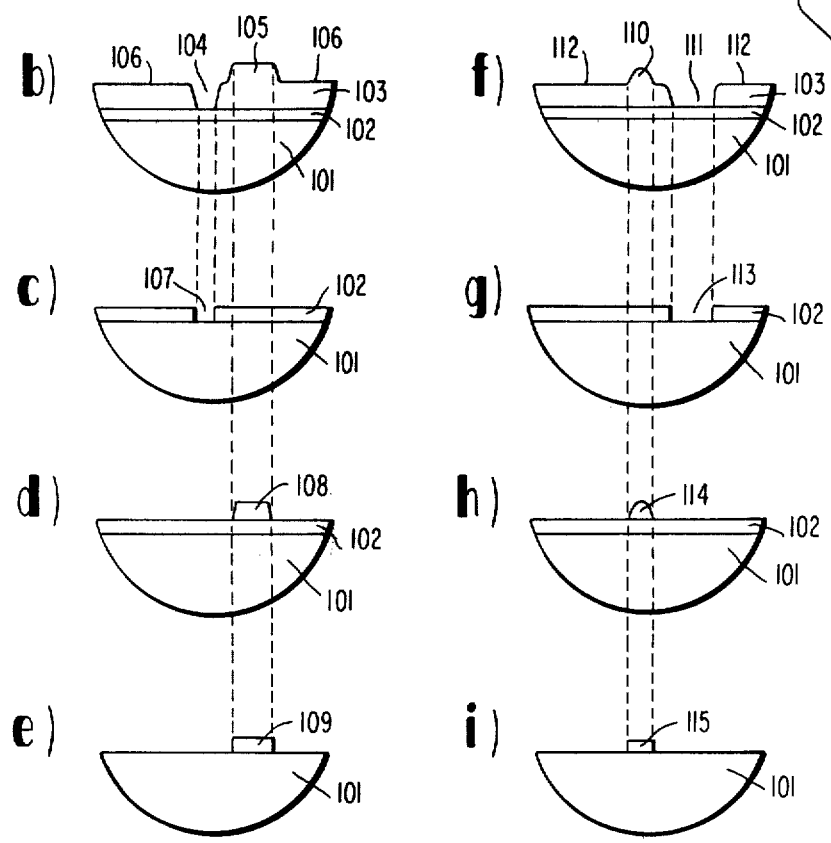
FIG. 10 illustrates side sections of a photographic material showing the steps of the process of one embodiment of the present invention.

FIG. 10 (a) through (i) illustrate another process to obtain fine lines using a transparent raised image and a photoresist plate. FIG. 10 (a) illustrates a photoresist plate 100 on which the gelatin raised image is superposed with the gelatin raised image 96 in contact with the photoresist layer 103 which is coated on an opaque thin layer 102 coated on a transparent substrate 101. The opaque layer 102 can comprise a metal such as aluminum, silver, copper, chromium, nickel, gold, titanium, tantalum, platinum, palladium, molybdenum and the like, a metal oxide such as iron oxide, chromium oxide, copper oxide, cobalt oxide and the like, a semiconductor such as silicon, germanium and the like, or an insulator such as silicon oxide, silicon nitride and the like. FIG. 10 (b) through (i) illustrate enlarged side sections of the circled region in FIG. 10 (a) for each step of the process.

FIG. 10 (b) illustrates the photoresist plate after development wherein the photoresist layer 103 is a positive type and the amount of the uniform light exposure is insufficient. The shape of the side section of the photoresist layer corresponds to that of the light intensity distribution in FIG. 3. 104 is the portion where the light intensity was at a maximum and the photoresist thereof is removed completely by development thereby, exposing the opaque layer 102. 105 is the portion where the light intensity was at a minimum and the photoresist thereof is not removed by development. 106 is the portion where the light intensity was a medium intensity which is equal to that of the uniform light and the photoresist thereof is removed slightly by development. FIG. 10 (c) shows the side section of the plate after the opaque layer is etched and the remaining photoresist is removed. When aluminum is used as the opaque layer and AZ-1350 is used as the positive type photoresist, an aqueous solution of phosphoric acid and nitric acid can be used as an etchant for aluminum and an about 1% aqueous solution of sodium hydroxide can be used as the developer of the photoresist layer. The line width of the etched portion 107 can be made as small as 0.2 microns. FIG. 10 (d) illustrates the photoresist plate after development wherein the amount of the uniform light exposure was just sufficient. The photoresist layer is removed except the portion 108 where the light intensity was at a minimum. After etching of the opaque layer 102 and removal of the remaining photoresist, the opaque line 109 is obtained as shown in FIG. 10 (e).

FIG. 10 (f) through (i) are similar to FIG. 10 (b) through (e) except that the photoresist layer 103 is a negative type. In FIG. 10 (f) 110 designates the portion where the light intensity was at a maximum and 111 designates the portion where the light intensity was at a minimum. 112 is the portion where the light intensity was a medium intensity. In FIG. 10 (g) a fine 113 is shown which is obtained after etching of the layer 102 and removal of the remaining photoresist. FIG. 10 (h) illustrates the photoresist plate after development wherein the amount of the uniform light exposure was insufficient. 114 is a fine photoresist line where the light intensity was at a maximum. After etching of the layer 102 and removal of the remaining photoresist, a fine opaque line 115 is obtained as shown in FIG. 10 (i). A transparent layer can also be used instead of the opaque layer 102.

The following examples are given to illustrate the invention in greater detail. Unless otherwise indicated, all parts, percents, ratios and the like are by weight.

EXAMPLE 1

A positive type photoresist AZ-1350 made by the Shipley Company was coated on a glass substrate to provide a dried thickness of 0.8 microns. An emulsion mask having black lines of a width of 5 microns was superposed on the photoresist layer with the emulsion layer in contact with the photoresist layer, and then the photoresist layer was uniformly exposed through the photomask to ultra violet light. The photoresist layer was then developed with the 2% aqueous solution of sodium hydroxide. After rinsing the plate with water, the plate was dried. The photoresist image thus obtained was baked at 120°C for 5 minutes to harden.

Another AZ-1350 layer was prepared on another glass substrate to provide a dried thickness of 0.8 microns. After drying, the raised image was superposed on the photoresist layer with the raised image in contact with the photoresist layer. Then the photoresist layer was uniformly exposed through the raised image to ultra violet light. The photoresist layer was then developed using the same developer as described above to form photoresist outlines of a width of about 0.5 microns.

The width of the outlines depends on the amount of the light exposure. The larger the amount of the light exposure is, the smaller is the width of the outlines.

EXAMPLE 2

A negative type photoresist KMER made by the Eastman Kodak Company was coated on a glass plate to provide a dried thickness of 0.8 microns. The photoresist layer was baked at 90°C for 10 minutes. Then, AZ-1350 was coated on the KMER layer to provide a dried thickness of 0.8 microns. After baking for 3 minutes at 90°C, the photoresist layers were uniformly exposed to ultra violet light in the same way as described in Example 1. The AZ-1350 layer was then developed with the developer described in Example 1 to form a raised image on the KMER layer. After uniformly exposing the KMER layer to the same ultra violet light, the AZ-1350 raised image was removed with acetone and then the KMER layer was developed with xylene to form hollow lines of a width of about 0.6 microns in the KMER layer corresponding to the outlines of the raised image.

EXAMPLE 3

Aluminum was deposited by vacuum evaporation on a glass substrate to form a thickness of 0.1 microns. AZ-1350 was coated on the aluminum layer to provide a dried thickness of 0.5 microns. The photoresist layer was baked at 90°C for 3 minutes.

A gelatin raised image was separately prepared as follows;

A silver image having 25 micron wide black lines was formed on a Kodak High Resolution Plate made by the Eastman Kodak Company using a known method. The silver image was bleached using the following bleaching solution (20°C, 2 minutes)

| Bleaching Solution | |
|---|---|
| Potassium Dichromate | 2 g |
| Hydrochloric Acid (30%) | 5 ml |

-continued

| | |
|---|---|
| Water to make | 1 liter |

After rinsing with water, the silver chloride was removed using Kodak Rapid Fixer (trade name, made by the Eastman Kodak Company) having the composition set forth below.

| | |
|---|---|
| Water, | 600 cc |
| Sodium Thiosulfate | 360.0 g |
| Ammonium Chloride | 50.0 g |
| Sodium Sulfite (anhydrous) | 15.0 g |
| Acetic Acid, 28% | 48.0 cc |
| Boric Acid, crystals | 7.5 g |
| Potassium Alum | 15.0 g |
| Cold water to make | 1.0 liter |

After rinsing with water, the gelatin layer was dried to form a raised gelatin image corresponding to the silver image.

The resultant raised image was superposed on the photoresist layer obtained above, and then uniformly exposed to ultra violet light. The exposure conditions were as follows:

| | |
|---|---|
| Exposure apparatus: | VZDRHG 200 made by the Karl Zeiss Co. |
| Distance between the light source and the photoresist layer: | about 2 feet |
| Exposure time: | 4 seconds |

After exposure the photoresist layer was developed in an aqueous solution of sodium hydroxide of a concentration of about 1% for 1 minute. After the development it was found that the aluminum was etched away where the photoresist was removed completely. The remaining photoresist was removed using acetone to form clear lines of a width about 0.4 microns corresponding to the outlines of the silver image.

EXAMPLE 4

The same procedure as described in Example 3 was carried out except that the uniform exposure time was 6 seconds and that the aluminum layer was etched with the following etchant for 3 minutes after the development of the photoresist layer.

| Etchant for Aluminum: | parts by volume |
|---|---|
| Nitric Acid | 4 |
| Phosphoric Acid | 80 |
| Water | 18 |

After removal of the remaining photoresist, aluminum lines of a width of 1.2 microns were obtained.

EXAMPLE 5

KMER was coated on a glass substrate to provide a dried thickness of about 1.4 microns and was baked at 90°C for 10 minutes. The photoresist layer was uniformly exposed to ultra violet light for 14 seconds in the same way as described in Example 3. Then the photoresist layer was developed in xylene for 30 seconds, and then rinsed with isopropyl alcohol and dried. After the developed photoresist was baked at 120°C for 30 minutes, the glass plate was etched in the following etchant for 20 seconds.

| Etchant for Glass: | parts by volume |
|---|---|
| Hydrofluoric Acid (49%) | 10 |
| Nitric Acid (79%) | 90 |

After rinsing with water, the remaining photoresist was removed by immersing the plate in concentrated sulfuric acid at 95°C for 10 minutes. After rinsing and drying hollow lines of a width of about 2 microns were obtained on the glass substrate. This was usable as a durable raised image.

EXAMPLE 6

The same procedure as described in Example 1 was carried out except that a transparent raised image prepared as follows was used.

The silver image obtained in Example 3 was treated in the following etching bleach solution for 3 minutes.

| Etching Bleach Solution: | | |
|---|---|---|
| Solution A: | Cupric Chloride | 10 g |
| | Citric Acid | 10 g |
| | Water to make | 1 liter |
| Solution B: | 3% Aqueous Solution of hydrogen peroxide | |

Equal parts by volume of Solution A and B were mixed to prepare a working solution before use.

The gelatin binder at the silver image areas was etched away leaving a gelatin relief corresponding to the non-image areas. The gelatin relief was rinsed with water and dried to form a gelatin raised image.

EXAMPLE 7

The same procedure was described in Example 1 was carried out except that a transparent raised image prepared as follows was used.

A silver halide photographic plate comprising a silver halide emulsion layer containing silver bromide particles with an average size of 0.06 microns dispersed in gelatin coated on a plate was exposed to an optical image and then developed. The developed silver image was then bleached with the bleaching solution used in Example 3. Then the emulsion layer was rinsed with warm water at 50°C to wash off the gelatin at the non-image areas. After rinsing with water the silver chloride at the remaining image areas was removed using Kodak Rapid Fixer leaving a transparent gelatin raised image.

While the invention has been described in detail and with reference to specific embodiments thereof, it will be apparent to one skilled in the art that various changes and modifications can be made therein without departing from the spirit and scope thereof.

What is claimed is:

1. A method for forming micropatterns comprising forming a transparent raised image on a photosensitive layer of a photographic material,
uniformly exposing said photosensitive layer through said transparent raised image to parallel light to which said photosensitive layer is sensitive, so that the light intensity at the edges of said transparent raised image is non-uniform such that the portions of the photosensitive layer underlying said edges are not exposed, and developing said photosensitive layer to form a micropattern corresponding to the outlines of said transparent image.

2. The method as described in claim 1, wherein said photographic material comprises a photoresist layer coated on a transparent substrate.

3. The method as described in claim 1, further comprising etching the exposed areas where said photosensitive material was removed by said developing, and removing the remaining photosensitive material.

4. The method as described in claim 3, wherein said photographic material comprises a photoresist layer coated on a thin etchable layer formed on a transparent substrate.

5. The method as described in claim 4, wherein said thin layer comprises a material selected from the group consisting of aluminum, silver, copper, nickel, chromium, titanium, iron oxide, copper oxide, chromium oxide, cobalt oxide, nichrome, tantalum, silicon, germanium, silicon oxide, silicon nitride, gold, platinum, palladium and molybdenum.

6. The method as described in claim 1, wherein said transparent raised image is a photoresist formed on a transparent substrate.

7. The method as described in claim 1, wherein said transparent raised image is a gelatin raised image formed on a transparent substrate.

8. The method as described in claim 7, wherein said gelatin raised image is a dichromate bleached silver image formed in a silver halide emulsion layer.

9. The method as described in claim 7, wherein said gelatin raised image is an etching bleached silver image formed in a silver halide emulsion layer.

10. A method for forming micropatterns comprising superposing a transparent raised image formed on a transparent substrate on a photosensitive layer of a photographic material, uniformly exposing said photosensitive layer through said transparent raised image to parallel light to which said photosensitive layer is sensitive, so that the light intensity at the edges of said transparent raised image is non-uniform, such that the portions of the photosensitive layer underlying said edges are not exposed, and developing said photosensitive layer to form a micropattern corresponding to the outlines of said transparent image.

11. The method as described in claim 10, wherein said transparent raised image is a positive type photoresist formed on a negative type photoresist layer coated on a transparent substrate.

12. The method as described in claim 10, wherein said photographic material comprises a photoresist layer coated on a transparent substrate.

13. The method as described in claim 10, further comprising, etching the exposed areas where said photosensitive material was removed by said developing, and removing the remaining photosensitive material.

14. The method as described in claim 13, wherein said photographic material comprises a photoresist layer coated on a thin etchable layer formed on a transparent substrate.

15. The method as described in claim 14, wherein said thin layer comprises a material selected from the group consisting of aluminum, silver, copper, nickel, chromium, titanium, iron oxide, copper oxide, chromium oxide, cobalt oxide, nichrome, tantalum, silicon, germanium, silicon oxide, silicon nitride, gold, platinum, palladium and molybdenum.

* * * * *